(12) United States Patent  (10) Patent No.: US 6,696,925 B1
Aiello, Jr.  (45) Date of Patent: Feb. 24, 2004

(54) ELECTRICAL REVENUE METER AND INSTRUMENT TRANSFORMERS MOBILE STATION

(75) Inventor: Michael E. Aiello, Jr., Covington, GA (US)

(73) Assignee: Lynn-Edward Professional Services, Inc., Covington, GA (US)

( * ) Notice: Subject to any disclaimer, the term of this patent is extended or adjusted under 35 U.S.C. 154(b) by 167 days.

(21) Appl. No.: 10/077,087

(22) Filed: Feb. 15, 2002

(51) Int. Cl.[7] .............................................. H04N 11/04
(52) U.S. Cl. ......................... 340/310.01; 340/310.07; 340/310.08; 361/602; 361/603
(58) Field of Search .................. 340/310.01, 310.07, 340/310.08, 638, 635; 361/601, 602, 603, 625; 307/9.1

(56) References Cited

U.S. PATENT DOCUMENTS 3,942,168 A * 3/1976 Whyte .................... 340/310.01

* cited by examiner

Primary Examiner—Julie Lieu
(74) Attorney, Agent, or Firm—Kilpatrick Stockton LLP

(57) ABSTRACT

A mobile metering system (MMS) comprises a trailer-mounted fully-enclosed three-phase set of current transformers (CTs) and power transformers (PTs), and a metering interface. The instrument transformers reduce the source voltage to a meterable level. The MMS enclosure enables a single utility work crew to connect source-side power bushings mounted on the roof of the MMS to conductors from a compatible source, such as the secondary side of a substation transformer, without the need for a bucket truck. Load-side power bushings are also mounted on the roof of the MMS for connection to the power distribution network. An electromagnetic locking system prevents access to the interior of the enclosure while the MMS is energized. A rigid ground grid mounted on the roof of the MMS grounds the insulators, a ground loop grounds the CTs and PTs, and both the ground grid and the ground loop are connected to the earth ground.

23 Claims, 7 Drawing Sheets

ELECTRICAL REVENUE METER AND INSTRUMENT TRANSFORMERS MOBILE STATION

FIELD OF THE INVENTION

This invention relates generally to electrical metering, and in particular to providing a portable apparatus for metering.

BACKGROUND

The manner in which electrical power is generated and distributed is generally of no concern to a consumer who has simply come to expect that electrical power will always be available. The distribution of electrical power, however, is not a simple task. On a basic level, a power system takes electrical power from a generator, such as a steam or hydraulic turbine, and transports the electrical power over a distribution network to the customers' premises. On a more detailed level, the distribution network is a network of lines, often both overhead and underground, and includes transmission, sub-transmission, and distribution lines. The voltages on the lines are stepped up at the generator, and then progressively stepped down or reduced as the electrical power travels from the transmission lines, to the sub-transmission lines, and then to the distribution lines. The distribution lines then carry the electrical power to the customers' premises, where the electrical power is typically stepped down once more before being transported to the customers' wiring.

In addition to the lines and generators, a power distribution network also includes a number of transformers dispersed throughout the network. In general, a transformer is a device that takes electrical power having one voltage and outputs the same electrical power at a different voltage. A transformer has a set of primary windings or coils which are coupled to a set of secondary windings or coils, with the primary and secondary windings often being immersed in oil. Based on a ratio of the number of primary windings to the number of secondary windings, the voltage can be stepped up to a higher voltage or stepped down to a lower voltage as the electrical power passes from the primary windings to the secondary windings. The transformers are used extensively throughout the network and couple generators to the transmission lines, step down the voltages between the transmission lines and sub-transmission lines, step-down voltages between the sub-transmission lines and the distribution lines, and finally step-down voltages between the distribution lines and the customer premises.

For electrical power to be distributed by local utilities or utilized by large industrial customers, transmission voltages, typically, greater than 25 kV, must be stepped down for introduction into a distribution grid. Typically, this voltage reduction is accomplished by a substation transformer. Occasionally, these transformers must be replaced or repaired. During this time, the defective transformer must be disconnected from the power network so that the necessary work can be safely performed. Frequently, an electrical revenue meter and associated instrument transformers are located in close proximity to the transformer so when the defective transformer is disconnected from the network the electrical revenue meter and associated instrument transformers are necessarily also disconnected. As a result, the electrical revenue meter and associated instrument transformers are unable to measure the amount of power that is being provided through a temporary hook-up, such as through a temporary transformer. Because the electrical revenue meter and associated instrument transformers are inoperable during repairs and replacement of a transformer, the amount of power being delivered through the network is often estimated based on historical usages or other such averages. For example, the amount of power used for the same period last year may form the basis for the estimate of power delivered during the work period. The estimates of power usage are subject to a great degree of inaccuracy, especially in light of inevitable weather and load variations. Inaccurate estimates typically translate into over- or under-recovery of revenue from the sale of electric power. This estimate is often an unsatisfactory measure of the power and may be commercially unacceptable to the interested entities.

Electrical power, as with many other utilities, is being deregulated or has been deregulated in many states. The price for power no longer remains relatively constant year-by-year but instead can fluctuate day-by-day or even hour-by-hour. The fluctuations and volatility in electric power pricing is most evident in the electrical power crisis that affected California in 2001 and continues to plague California as a result of deregulation. California experienced escalating prices for electrical power and demand which exceeded the capacity of the power grid. Consumers took drastic measures to reduce their consumption of electrical power and experienced black-outs, rolling black-outs, and brown-outs. The price of electrical power is therefore no longer a routine fixed cost.

Because of deregulation and also other market conditions, more accurate metering of electrical power is being mandated while work is being performed on the network. As mentioned above, the metering associated with a transformer is so closely associated with the transformer that it effectively cannot be used during the work period. However, temporary metering can be accomplished by bypassing the permanent substation meters and substituting a temporary metering station.

Installing the temporary metering station typically involves a labor-intensive, time-consuming, and therefore, expensive process. Installation usually requires a first work crew, using the auger of a digger derrick or similar earth moving equipment, to dig an approximately 10' deep hole. Using a distribution crane, a second work crew lifts a distribution power pole and "sets" the pole in the hole, which is then backfilled with dirt. Next, an "instrument cluster" is constructed. For each phase, the instrument cluster includes two instrument transformers. Typically, one of the instrument transformers is a current transformer (CT) for reducing the current, and the other is a potential transformer (PT) for further reducing the voltage to levels that are suitable for measurement using meter instruments. Using a hydraulic tool, the distribution power pole is bored such that the instrument cluster can be mounted thereon. For each phase, connections are made between the secondary side of the substation transformer and each CT and PT. A third crew typically uses a bucket truck to mount the instrument cluster and make the connections. Secondary conductors are buried, slack-spanned, or tension-spanned from the substation transformer to the instrument cluster, and from the instrument cluster to the other substation equipment. Metering conductors are connected at one end to the CT and the PT, and the metering conductors are enclosed in a conduit that is attached down the length of the pole. The other ends of the metering conductors are attached to metering instruments. Only after this work is completed can the temporary substation transformer be energized and the power usage measured by the electrical meter. As can be appreciated by those skilled in the art, the entire process is a custom installation that may take dozens of man-hours to complete, requires the coordination between several work crews, and is a costly endeavor that can easily exceed $10,000.

The work involved in placing a meter is a fraction of the work involved in replacing a defective transformer. As mentioned above, when a defective transformer is being repaired or replaced, a temporary transformer can be brought to the premises to fulfill the functions of the defective transformer while the work is being performed. When the defective transformer is a substation transformer, this temporary transformer is transported to the work site with a tractor-trailer, and is commonly referred to as a "mobile substation." U.S. Pat. No. 4,367,512 to Fujita, U.S. Pat. No. 4,427,898 to Miyake et al., U.S. Pat. No. 4,562,360 to Fujimoto, and U.S. Pat. No. 6,272,733 to Baker, Jr., all of which are incorporated herein by reference, describe temporary portable transformers that may be brought to a work site during the change-out of a defective transformer. As described in these patents, the temporary transformer is connected to the lines to provide the necessary connections previously provided by the defective transformer. Once a new transformer is installed and connected, this temporary transformer is removed. These temporary mobile transformers greatly simply the process of replacing a defective transformer while at the same time maintaining the distribution of power.

One challenge in performing any type of repair within the power network, but which is especially true in replacing a transformer in a substation, is working within the constraints of available space. Often, the substations are dispersed throughout the countryside, at times in remote locations and in fenced-in locations that offer only very limited maneuverability. The rough terrain and limited space can make it difficult for work crews and the tractor-trailers to even access the work site, let alone to move around the site to perform the necessary repairs.

A need therefore exists for improved systems and methods for use when performing work on a power network. A need also exists for systems and methods for use in measuring power delivered while work is performed on the power network that are less costly, more efficient, and which offer a practical solution given the space constraints within the power network.

SUMMARY

The present invention addresses the needs identified above by providing systems and methods for monitoring and metering power distribution parameters for a number of purposes at a variety of locations within a power transmission or distribution network. The systems are self-contained and easily transportable to a metering point on an electrical power transmission or distribution network. At the metering point, the systems are adapted to receive input conductors from a source, to transform parameters related to the input conductors, and to provide the transformed parameters to a metering instrument. The systems are also adapted to easily connect the input (source) conductors to output (load) conductors that are connected to a power network.

According to one embodiment, the system comprises a pre-assembled mobile metering system (MMS) for temporary metering. The MMS includes an enclosed pre-wired three-phase metering apparatus. The enclosure protects interior components from atmospheric conditions, and provides easy access to the components when the MMS is de-energized. The parameters monitored by the metering apparatus include current and voltage. The MMS receives high voltage inputs by connecting the secondary side conductors and neutrals of a movable or fixed substation transformer to power bushings and neutral terminals mounted on exterior of the MMS. The MMS transforms the inputs using enclosed metering instruments such as current transformers and potential transformers, and provides meterable currents and voltages that accurately reflect the values of the high voltage inputs. The meterable currents and voltages are safely accessed via an external metering cabinet.

The MMS provides much greater portability than conventional approaches to metering and monitoring power parameters. The MMS is mounted on a trailer that is no more than approximately 16 feet long, such that its total size is compatible with over-the-road highway transportation without the need for large towing vehicles. The MMS is also maneuverable in or around a typical electrical substation yard, so as to gain access to pre-existing system elements, such as conductors leading from a substation transformer, mobile substation, load bus, or transmission line. In contrast, conventional approaches involve the transportation of components that are assembled on site in a process that involves several large vehicles performing the different tasks mentioned above. When the conventional system is no longer needed, the conventional system is disassembled and transported away from the metering point.

Another benefit of this invention is the relative ease of connecting and disconnecting the MMS to conductors and metering devices. The MMS has a reinforced roof that allows substation personnel to connect conductors and neutrals to the MMS while standing on the roof of the MMS enclosure. Therefore, there is no need to provide an additional aerial work surface, such as the bucket of a utility line truck. There is also no need for multiple work crews that are assigned to different types of utility vehicles. For example, a conventional approach may require a two-man crew to drive to the metering site to operate a digging tool, and a separate two-man crew to drive to the metering site to operate a crane. A third three-man crew is also required to drive a bucket truck to the metering site. One member of the bucket crew operates the bucket controls, a second member stands in the bucket and makes connections on the pole, and a third member of the bucket crew provides ground support by handing tools and materials to the second member. Using the MMS, at most, a two-man crew is needed to drive a tow vehicle to the metering point, to place tools and materials on top of the MMS, and to make connections to the MMS. Thus, the MMS can reduce the time taken to complete a metering installation from 1 day to as little as 30 minutes. Additionally, any necessary repairs, component replacements, or adjustments may be performed by simply de-energizing the MMS and accessing any component, without the need for a bucket truck. The outputs from the MMS to a metering instrument can also be easily accessed from the ground via a metering interface cabinet and a conduit that is integral to the load side of the MMS.

Another benefit of the MMS is the ability to utilize either an integral or an independent metering device. For instance, an electrical revenue meter can be permanently installed "onboard" the MMS. Alternatively, an external or removable revenue meter can be linked to the MMS, using for example, a 10-pole knife switch. This feature facilitates the uses of a variety of types of electrical revenue meters according to the requirements of each particular metering instance. For example, in one instance, a meter with remote communications capabilities may be desirable, while in another instance, remote communication may be unnecessary.

The MMS provides a variety of safety-oriented protective devices, such as an electromagnetic lock that prevents the interior of the MMS from being accessed while any interior components are energized. This feature functions to prevent serious injury or death to personnel, and damage to or theft of internal components. An integral grounding system is also provided, including an external ground grid that is mounted on the roof of the MMS, and an internal ground loop. In contrast, conventional approaches involve energizing components that are fully exposed, and thus subject to accidents and tampering. The integral grounding system creates a continuous ground path by interconnecting the neutral of the mobile substation, the external ground grid, the internal ground loop, and the buried ground plane of the fixed substation.

The MMS also provides compatibility with more than one transmission or distribution voltage. For example, the MMS can be dual or triple voltage rated, such that two or three different transmission voltage levels can be safely and accurately measured. Therefore, the need for multiple trailers for monitoring and metering a variety of metering points can be substantially reduced, or eliminated altogether.

The MMS may contain additional circuit components, such as switchgear, a three-phase recloser and/or a three-phase circuit breaker. The MMS may contain additional communications components and cabling, such as a remote terminal unit (RTU) that allows measurements to be made and control signals transmitted remotely. The MMS can also contain a station service transformer that provides AC power to the substation to maintain battery chargers, and to power outlets and lighting.

Additional objects, advantages and novel features of the invention will be set forth in part in the description which follows, and in part will become more apparent to those skilled in the art upon examination of the following, or may be learned by practice of the invention.

BRIEF DESCRIPTION OF THE DRAWINGS

The accompanying drawings, which are incorporated in and form part of the specification, illustrate the present invention when viewed with reference to the description, wherein.

DETAILED DESCRIPTION

Detailed embodiments of this invention are disclosed herein; however, it is to be understood that the disclosed embodiments are merely exemplary and that the invention may be embodied in various and alternative forms. The figures are not necessarily to scale; some features may be exaggerated or minimized to show details of particular components. Therefore, specific structural and functional details disclosed herein are not to be interpreted as limiting, but merely as a basis for the claims and as a representative basis for teaching one skilled in the art to variously make and use this invention.

For the purposes of this description, the system monitors currents and voltages and is useful at a substation during a substation transformer outage. A substation transformer outage typically occurs during scheduled preventative maintenance activities or when the substation transformer fails due to overheating or to a catastrophic event such as a fire or storm. To minimize the duration of the power outage for the customers served via the out-of-service substation transformer, a temporary transformer may be delivered to the site to serve while the failed substation transformer is being repaired or replaced. Because the meter bank associated with the failed transformer may be inoperative or inaccessible, temporary metering is also required during the substation transformer outage. However, the systems and methods of this invention are also useful for monitoring and metering a variety of parameters associated with electric power delivery, such as power quality, demand, time-of-use, harmonics, voltage drop, and transformer losses. Monitoring and metering may be performed for a variety of reasons, such as to detect theft or diversion of power, or to monitor and meter a temporary load. These systems and methods are also useful at various locations, including system substations, customer-owned substations, and at any point along transmission or major distribution lines.

Figure 1:
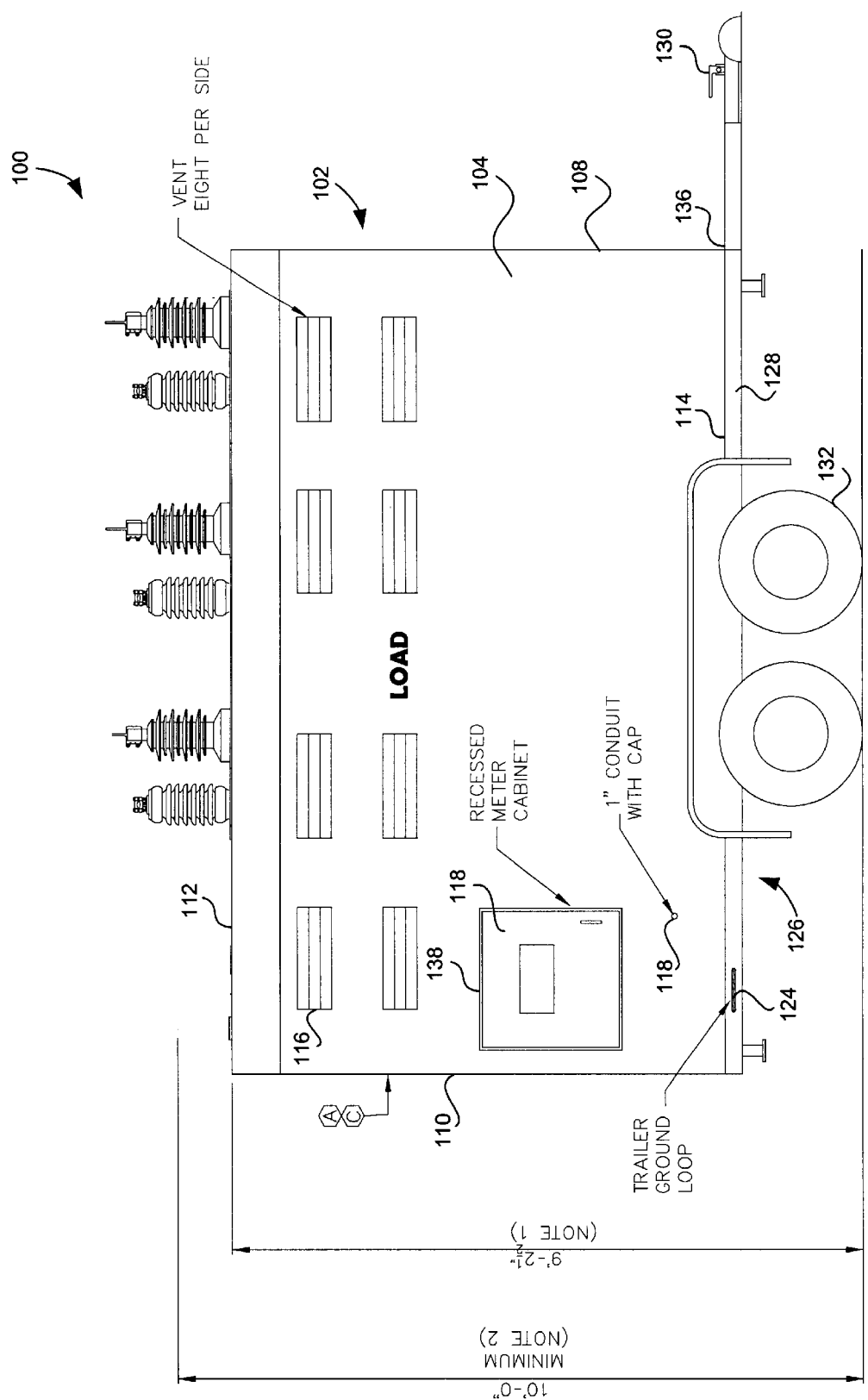
FIG. 1 is a load side view of an embodiment of a mobile metering system (MMS).

FIG. 1 is a load side view of an embodiment of the mobile metering system (MMS) 100. The overall configuration of the MMS 100 is designed to facilitate over-the-road transportation, such that the MMS 100 is typically towed behind a suitable electric utility vehicle. The MMS 100 comprises a trailer enclosure 102 having a load side panel 104, a source side panel 106, a front panel 108, a rear panel 110, a roof panel 112, and a floor 114.

The load and source side panels 104, 106 each include ventilation panels 116 such as the eight louvered vents shown, or other perforations or apertures for allowing the ingress and egress of air. Each ventilation panel 116 can also include an active element such as a fan unit. The load side panel 104 is also penetrated by a one-inch conduit 118 with a detachable conduit cap 120, and by a ground connection 122 to the trailer ground loop 124.

The trailer body is supported by an undercarriage 126 having a frame 128 with a trailer hitch 130 extending approximately 3 feet forwardly from the trailer enclosure 102. The frame 128 has roughly the same dimensions as and supports the floor 114 of the trailer body 102. The undercarriage 126 is supported from the ground by wheels 132. The trailer hitch 130 is designed to provide for straightforward interconnection of the MMS 100 with a towing vehicle 134, and includes standard towing components, such as a 2⁵⁄₁₆" hitch ball mounted on a Class 3 receiver.

A wiring harness connector 136 connects the trailer body 102 to the electrical system of the towing vehicle 134, and is typically a standard 7-position blade-style connector. Electrically interconnecting the MMS 100 and the towing vehicle 134 provides power to the components of the MMS 100, and enables the activation of the appropriate vehicular signaling electronics such as trailer marker lights, turn signals, and brake lights (not shown). Peripheral components (not shown) include stabilizing jacks, wheel chocks that are placed in the interior of the trailer enclosure 102, and a spotlight that is mounted in the rear of the trailer enclosure 102 and wired to both a 12 volt DC auxiliary wire of the wiring harness as well as to a trailer marker light wire of the wiring harness, such that the spotlight can be operated by the towing vehicle 134. The stabilizing jacks are installed on all four corners of the frame 128, and function to stabilize the MMS 100. The stabilizing jacks rotate downward from a stowed position to a down position. In the down position, a foot end of each jack makes contact with the ground. To return to the stowed position, a release latch in the center of each jack is activated, the foot of the jack is lifted, and the jack rotates upward. The wheel chocks are used to ensure that the MMS 100 will remain stationary while in use.

The size and configuration of the body 102 of the MMS 100 facilitates its use in a variety of circumstances. The enclosure enables the MMS 100 to achieve industry-mandated overhead safety clearances, while creating a relatively small "footprint" on the ground. The MMS 100 requires no additional space during installation, because all work can be performed on top of the MMS 100. This allows the MMS 100 to be positioned in an area that would not accommodate line trucks and cranes that are required to assemble and position conventional pole-mounted temporary metering installations. The MMS 100 is typically approximately 11 feet tall, and 6 feet wide, and less than 16 feet long, which facilitates towing behind a typical utility vehicle.

In the embodiment shown in FIG. 1, a metering interface cabinet 138 is recessed in the load side panel 104. The metering interface cabinet 138 is approximately 24 inches wide, 24 inches tall, and 12 inches deep. The internal components of the metering interface cabinet 138 are protected by a lockable cabinet door 140. The conduit 118 is located directly below the meter interface cabinet door 118 and provides access to the interior of metering interface cabinet 138. For example, fiber optic or other communications cabling can be routed through the conduit 118 to connect to an internal modem of a electrical revenue meter installed in the metering interface cabinet 138. The metering interface cabinet 138 houses components including an external metering interface safety test switch 142, a power flow selector control 144, a voltage selector control 146, a metering selector control 148, and a metering instrument 150.

The safety test switch 142 enables an operator to directly connect a metering instrument 148 using suitable conductors, such as eight- or ten-conductor metering cable. In one embodiment, multiple test switches 142 are installed in the metering interface cabinet 138, so as to utilize multiple metering instruments 150. For example, the MMS 100 may concurrently employ a permanently mounted metering instrument 150 and an interchangeable metering instrument 150. Furthermore, the safety test switch 142 can be hard-wired to the substation meter bank.

The power flow selector control 144 designates the proper direction of current flow to the metering instrument 150. The physical configuration and attendant space limitations of some fixed substations will not permit the MMS 100 to be oriented "load-to-load and source-to-source," i.e., with the load side panel 104 aligned with the load and the source side panel 106 aligned with the source. In these situations, the operator reverses the polarity of the MMS 100 by switching the power flow selector control 144.

In one embodiment, the MMS 100 can meter sites having multiple primary voltage levels. For instance, the MMS 100 may be "dual voltage" or "triple voltage" compatible, that is, compatible with two or three different source voltages. For example, a dual voltage MMS 100 can be constructed to have the ability to transform both 12 kV or 25 kV source voltages to a meterable level. In this embodiment, the voltage selector control 146 is utilized to select the proper transformer ratio for the voltage rating of the specific site that is to be metered. This feature reduces the need to construct a different system for every different commonly used voltage rating. For example, a single electric utility may maintain a 4 kV substation, a 12 kV substation, and a 25 kV substation. Rather than purchasing three MMS trailers, that utility may purchase one triple voltage rated MMS 100. Each time the MMS 100 is moved to a substation, the utility needs only to adjust the voltage selector control 146 to compensate for the voltage of the substation at which metering is to be performed.

The metering selector control 148 determines whether the metered signals are directed to a metering instrument 150 that is permanently installed ("on-board") as a component of the MMS 100, or to a metering instrument that is a separate component. The metering instrument 150 is preferably a 120 VAC secondary four-quadrant, demand-recording meter, although the MMS 100 is operable with any of various known 120 VAC secondary voltage meters. If the metering instrument 150 is a separate component, the metered signals are directed to the safety test switch 142.

Figure 2:
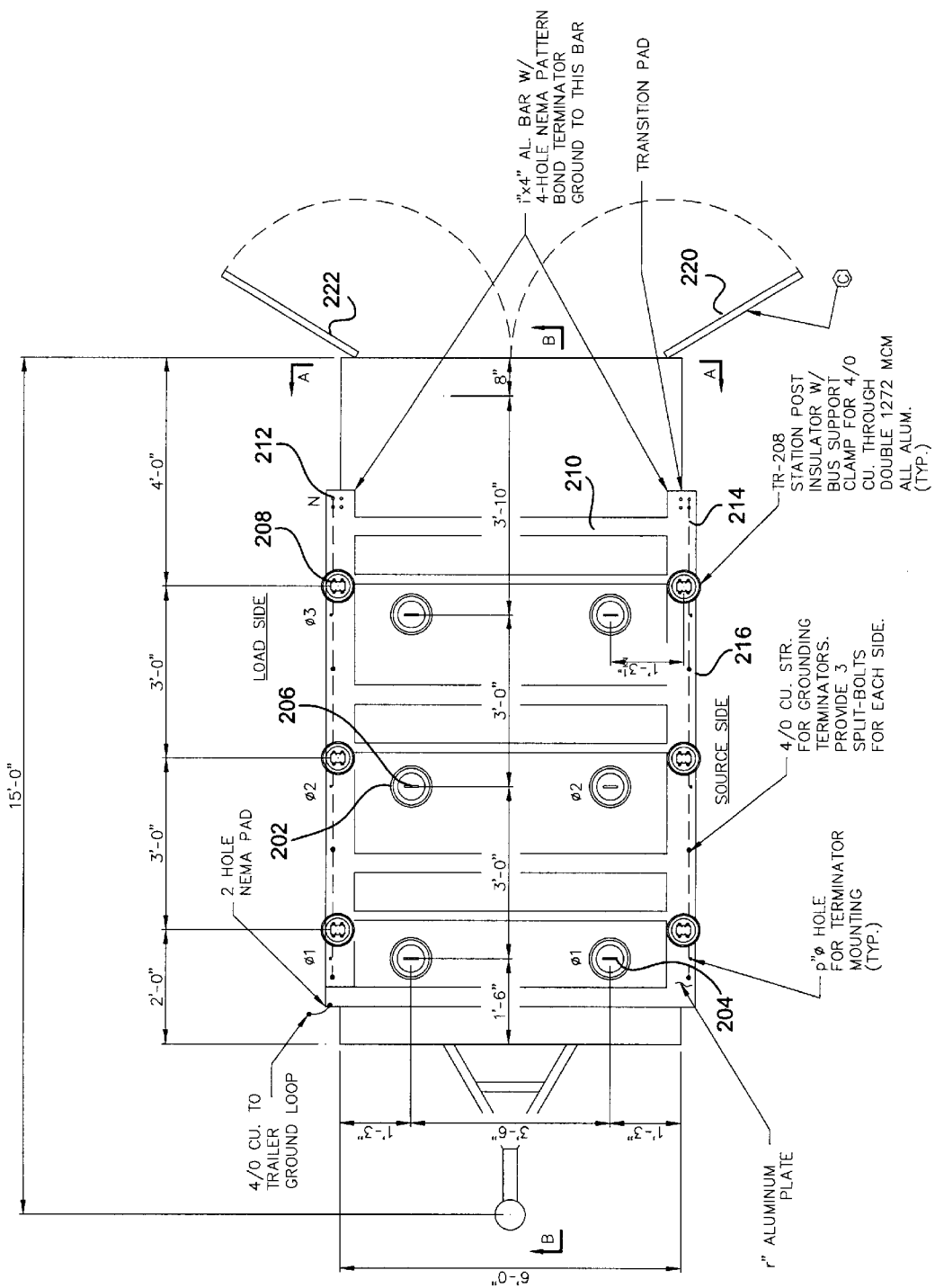
FIG. 2 is a plan view of the MMS of FIG. 1.

FIG. 2 is a plan view of an embodiment of the MMS 100, and shows the components that are installed on the roof panel 112. The roof panel 112 includes six 4-inch apertures 202 through which three source side bushings 204, and three load side bushings 206 are positioned. In this embodiment, each bushing 204, 206 is a 37.5 kV 2000A polymer composite power bushing of a type used in power transformers, and known by those skilled in the art. Each bushing 204, 206 is electrically isolated, thereby creating an insulated path for current to flow down to the interior components of the MMS 100 without exposing the exterior of the MMS 100 to high voltages. The bushings 204, 206 are arranged in three rows positioned approximately 3' apart and two columns positioned approximately 3.6' apart, the first row being substantially parallel to and positioned approximately 1.5' from the front panel 108 of the MMS 110. Each source side bushing 204 is for connecting a source side conductor (not shown) of one phase of the source to the interior components of the MMS 100. Each load side bushing 206 is for connecting a load side conductor (not shown) to the interior components of the MMS 100. Detachable protective covers (not shown) protect the bushings 204, 206 when the MMS 100 is in transit.

Six polymer station post insulators 208 are positioned along the load and source side edges of the MMS 100. Each station post insulator 208 is for clamping a conductor so as to prevent mechanical stress on the bushing 204, 206 to which the conductor is connected. Thus, the post insulators 208 provide for either low-tension strain relief, or "slack span" of source side conductors. A bus support clamp known in the art is attached to each post insulator 208, so as to be compatible with conductor sizes ranging from 4/0 copper to 1272 aluminum. Each post insulator 208 is mounted to and electrically insulated from the external ground grid 210. The external ground grid 210 is constructed preferably of a 6" aluminum neutral bar, and includes insulator support bars 212 upon which the post insulators 208 are directly mounted. The insulator support bars 212 run parallel to load and source side of the trailer enclosure 102. Neutral terminals 214 for terminating a concentric neutral, are preferably constructed of 4/0 copper cable and positioned beneath the external ground grid 210. The load side column of the station post insulators 208 is also interconnected by a suitable ground conductor 216, such as a 4/0 copper stranded conductor to a 2-hole NEMA pad (not shown), which is then connected to a trailer ground loop 124. The source side column of station post insulators 208 is similarly interconnected and connected to the ground loop 124. Each neutral terminal 214 is constructed of a 1"×4" aluminum bar that is electrically connected to a mobile substation neutral and to the fixed substation ground plane, via a 50' grounding cable 408 having grounding clamps on each end. Thus, dual layers of protection are provided. If the neutral terminal 214 connection is lost, the connection to the substation ground grid remains, and vice versa. An additional layer of protection can be added by providing an additional grounding cable 408. The trailer ground loop 124, together with the external ground grid 210, create a continuous grounding system that is integral to the MMS 100. The continuous grounding system increases the safety of the MMS 100 by electrically protecting all surfaces of the MMS 100. The continuous grounding system is pre-wired, thereby reducing the chance that utility personnel will forget to make the ground connections, and decreasing the labor involved.

The rear panel 110 of the MMS 100 includes a left and a right rear access door 220 and 222, each swinging outwardly from the center of the rear panel 110. The doors 220 and 222 feature an electromagnetic locking device that prevents potentially deadly accidents as well as costly theft or vandalism. The electromagnetic locking device is activated only when the doors 220, 222 of the MMS 100 are closed, and any of the internal components of the MMS 100 are energized. The activated electromagnetic locking device physically prevents the doors from being opened, thereby ensuring the safety of utility personnel or trespassers.

Figure 3:
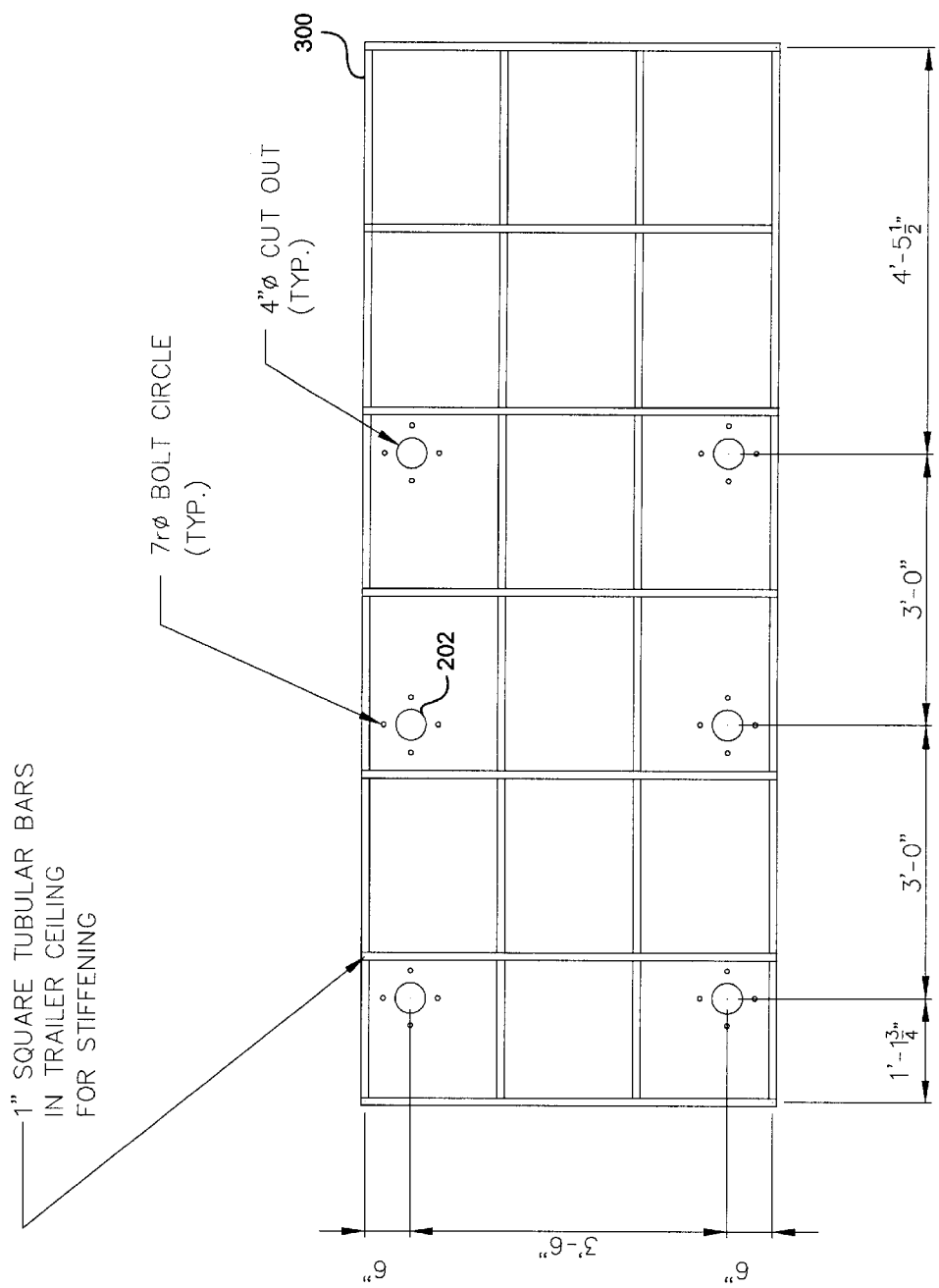
FIG. 3 is a plan view of the roof reinforcement frame for the MMS.

FIG. 3 is a plan view of a roof reinforcing frame 300, according to an embodiment of the invention. The roof reinforcing frame 300 reinforces the roof panel 112, such that at least two linemen or other technicians can be supported during the installation and connection of primary conductors 302 (not shown) to the MMS 100. The roof reinforcing frame 300 is constructed of any suitable rigid material such as 1-inch square tubular bars fashioned in a grid or other reinforcing arrangement, and is affixed or integral to the roof panel 112.

The MMS 100 is towed to a metering point, which is typically a point on a power line that is a component of a power transmission or distribution network. If necessary, the tow vehicle 134 can be disconnected before minor adjustments can be made to maneuver the MMS 100 into an optimal position for accessing source and load conductors and the substation grounding plane or other earth ground. The utility personnel chock the wheels of the MMS 100 and ground the MMS 100 by connecting the ground loop connection 122 to the substation ground plane or other earth ground. The controls 144, 146, 148, are set to the proper voltage, meter, and power flow settings. For each phase of the source for which metering or monitoring is to be performed, the source side of the power line is mechanically connected to a source side post insulator 208 and electrically connected to a source side power bushing 204. The load side of the line is mechanically connected to a load side post insulator 208 and is electrically connected to a load side power busing 206. The neutral conductors are connected to the neutral terminals 212. Then, the doors 220, 222 are closed, and the MMS 100 can be energized.

Figure 4:
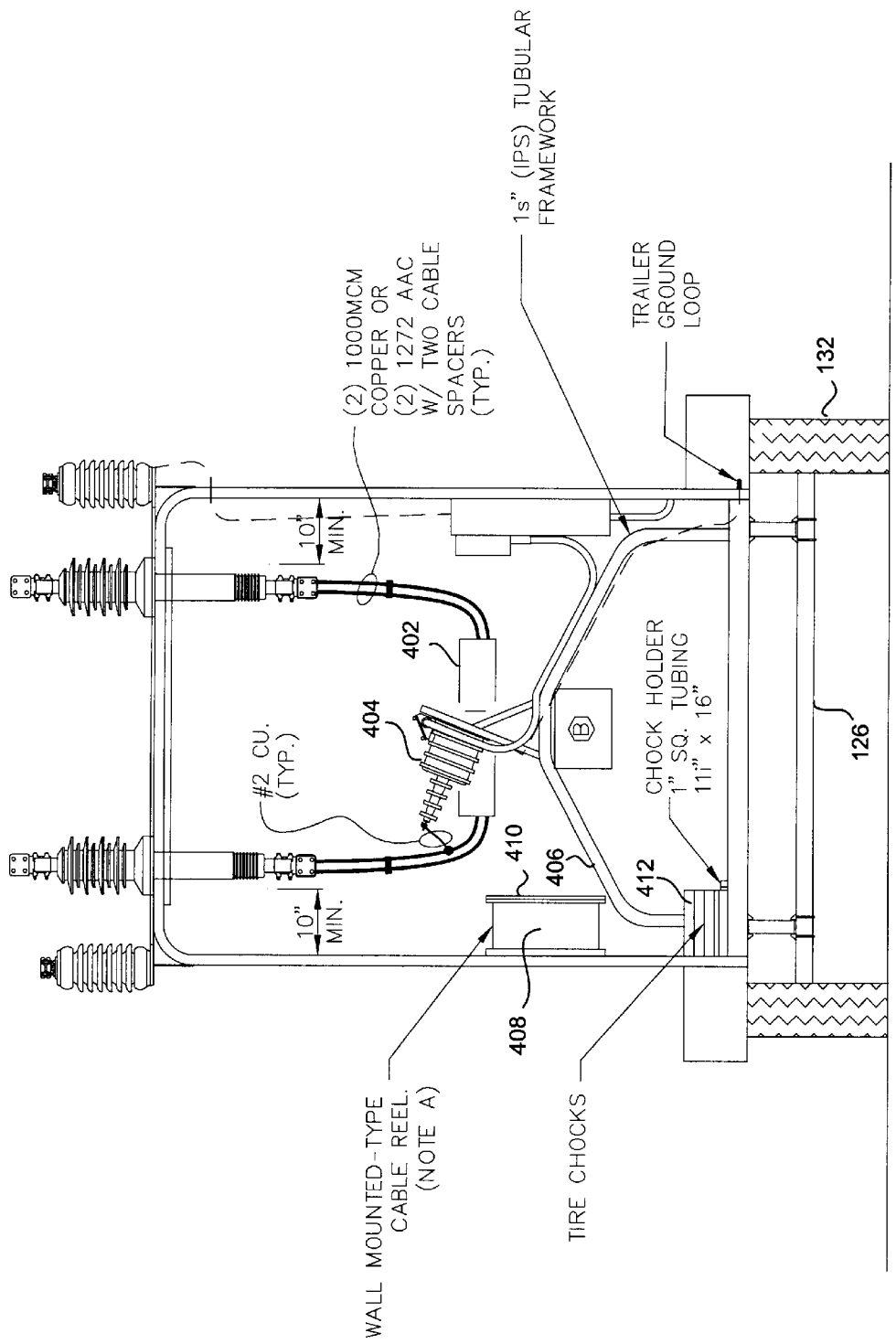
FIG. 4 is a section view showing the internal components of the MMS.

FIG. 4 is a section view with a vertical cutting plane, showing the internal components of an embodiment of the MMS 100. For each primary phase, the MMS 100 includes a current transformer 402 and a potential transformer 404 supported by a tubular frame 406. The frame 406 is affixed to the interior floor 112 and/or walls 104, 106, 108 of the MMS 100. The current transformer 402 and potential transformer 404 serve to insulate the metering instrument 150 and other components in the metering cabinet 138 from primary operating voltages and currents of a primary conductor 302. The current transformer (CT) 402 has a primary winding that is connected in series with the load for which current is to be measured or controlled. An exemplary CT 402 uses a 600:5 ratio, with a rating factor of 3. The potential transformer (PT) 404 also has a primary winding, which is connected, either line-to-line or line-to-neutral, in parallel with the load for which voltage is to be measured or controlled. An exemplary PT is rated for use at a particular voltage level, for example 4 kV, 12.5 kV, 13.5 kV, or 25 kV. Any suitable conductor can be used to connect the primary winding of the PT 404, such as #2 copper to the source side conductor. The secondary windings of the CT 402 and PT 404 provide a secondary current and a secondary voltage, which are substantially proportional to the respective primary current and primary voltage, at levels which can be safely and accurately measured using the metering instrument 150. Metering current and voltage using a CT 402 and PT 404 connected to each phase of a conductor is well known in the art, and therefore a more detailed discussion of the principles thereof is not required.

A cable reel 410 that contains the grounding cable 408 is mounted near the rear of the MMS 100, and is easily accessible when the rear access doors 220, 220 are opened. To ground the MMS 100, the grounding cable 408 is connected at one end to the ground loop connection 122 and at the other end, to the substation ground plane or other earth ground. Wheel chocks 412 are also stowed in the rear of the MMS 100.

Figure 5:
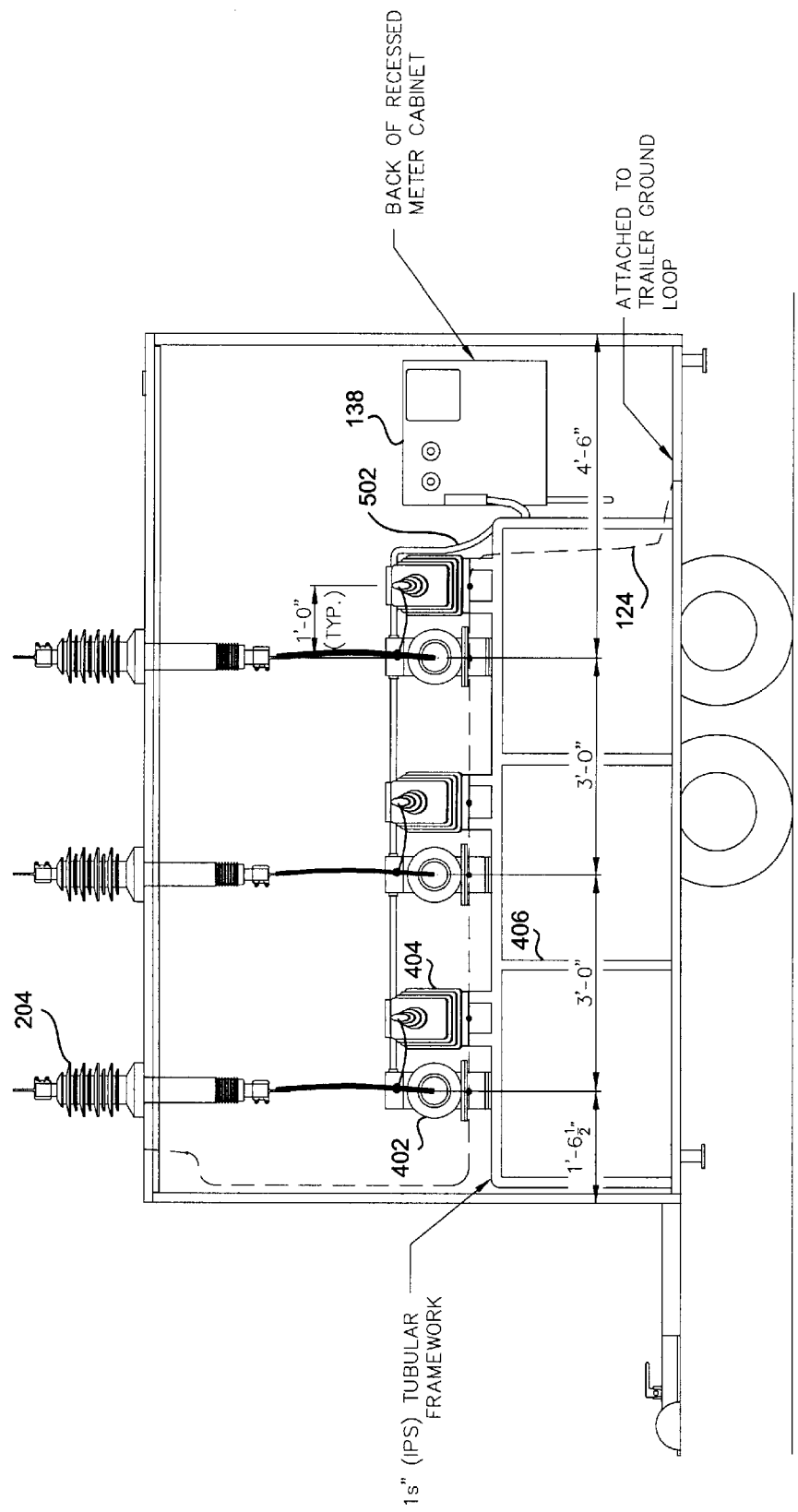
FIG. 5 is a section view showing the internal components of the MMS.

FIG. 5 is a section view of an embodiment of the MMS 100, with a vertical cutting plane running from the front panel 108 to the rear panel 10. A grounding terminal on each of the three CTs 402 and three PTs 404 is connected to the trailer ground loop 124. The trailer ground loop 124 continues through the trailer roof 112 to the load side neutral terminal 212. The load side neutral terminal 212 is mounted on the external ground grid 210. The secondary side of each instrument transformer is typically bundled together in the metering cable 502.

Figure 6:
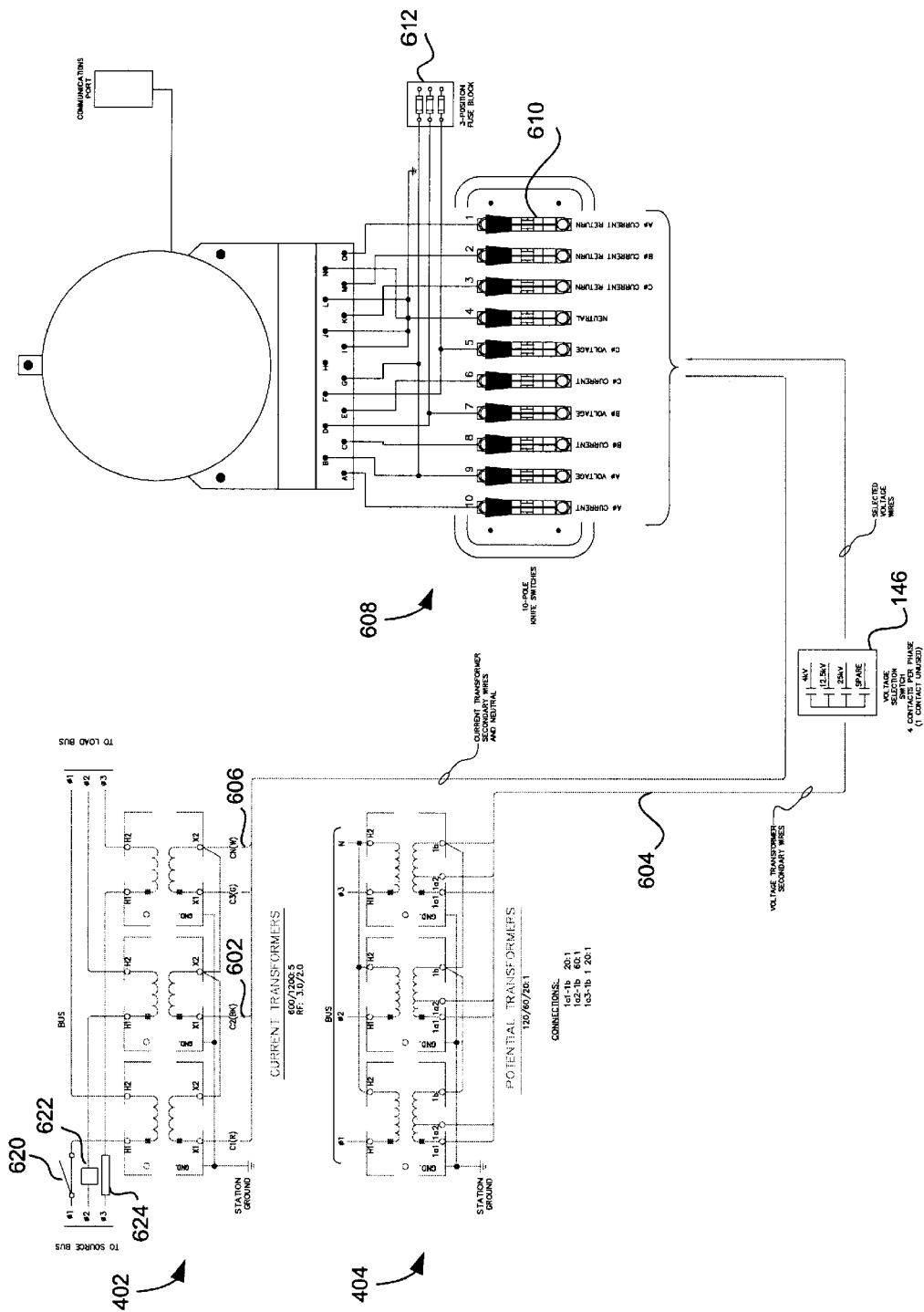
FIG. 6 is a schematic showing connections from instrument transformers within the MMS to a metering interface and metering instrument of the MMS.

FIG. 6 is a schematic of an embodiment of the components that are housed in the metering interface cabinet 138. Each CT 402 outputs a meterable current on a CT secondary wire 602. Each PT 404 outputs a meterable potential on a PT secondary wire 604. The CT secondary wires 602, along with the PT secondary wires 604 and neutrals 606 are fed into the metering interface cabinet 138. Once at the metering interface cabinet 138, each PT secondary wire 604 is electrically connected to the voltage selection control 146, power flow selection control 144, and the metering selection control 148. The individual CT secondary wires 602 and the neutrals are electrically connected to the safety test switch 142.

The safety test switch 138 typically includes a 10-pole knife switch 608. Each pole 610 of the safety test switch 138 corresponds to both to an input, such as a PT or CT conductor 602, 604, 606, and to a terminal on a metering instrument 150. The metering instrument 150 is preferably a four quadrant power electrical revenue meter with mass memory and an internal modem. The poles 610 that correspond to PT secondary wires 604 are electrically connected to an overcurrent device, such as a 3-position fuse block 612.

In one embodiment, the MMS 100 includes an onboard metering instrument 150. In this embodiment, the poles 610 of the safety test switch 138 can be hard-wired to the terminals of the metering instrument 150. In an alternative embodiment, the operator of the MMS 100 may manually electrically connect the safety test switch 138 to an external or interchangeable metering instrument 150, thereby providing flexibility in choosing metering instruments that are most appropriate for the particular situation. Furthermore, meter interchangeability reduces the need for extensive alteration of the MMS 100 as metering instrument and associated communications technology advances.

Without increasing the overall size and portability of the MMS 100, several other components may be use to increase the functionality thereof. For example, the MMS 100 can also house a switch 620, a recloser 622, and/or a circuit breaker 624, thereby replacing an equivalent but damaged device in a substation.

A remote terminal unit (RTU) (not shown) can be included in the MMS 100. The RTU provides real-time communications with and control of substation components from the MMS 100. For example, an RTU can allow a remote operator to monitor the voltage and current measured by the MMS 100, and to activate a switch to remove a recloser or circuit breaker MMS 100 from the circuit based upon the monitored reading.

The MMS 100 can contain a 10 kVA single-bushing station service transformer (not shown) that provides 120/240 VAC to the substation to maintain battery chargers, and to power outlets and lighting inside and around the substation. The station service transformer can be installed in any unused area within the MMS 100, and may replace a failed or otherwise inoperative station service transformer, or power a temporary station house. In another embodiment, a power transformer (not shown) is included in the MMS 100.

Figure 7:
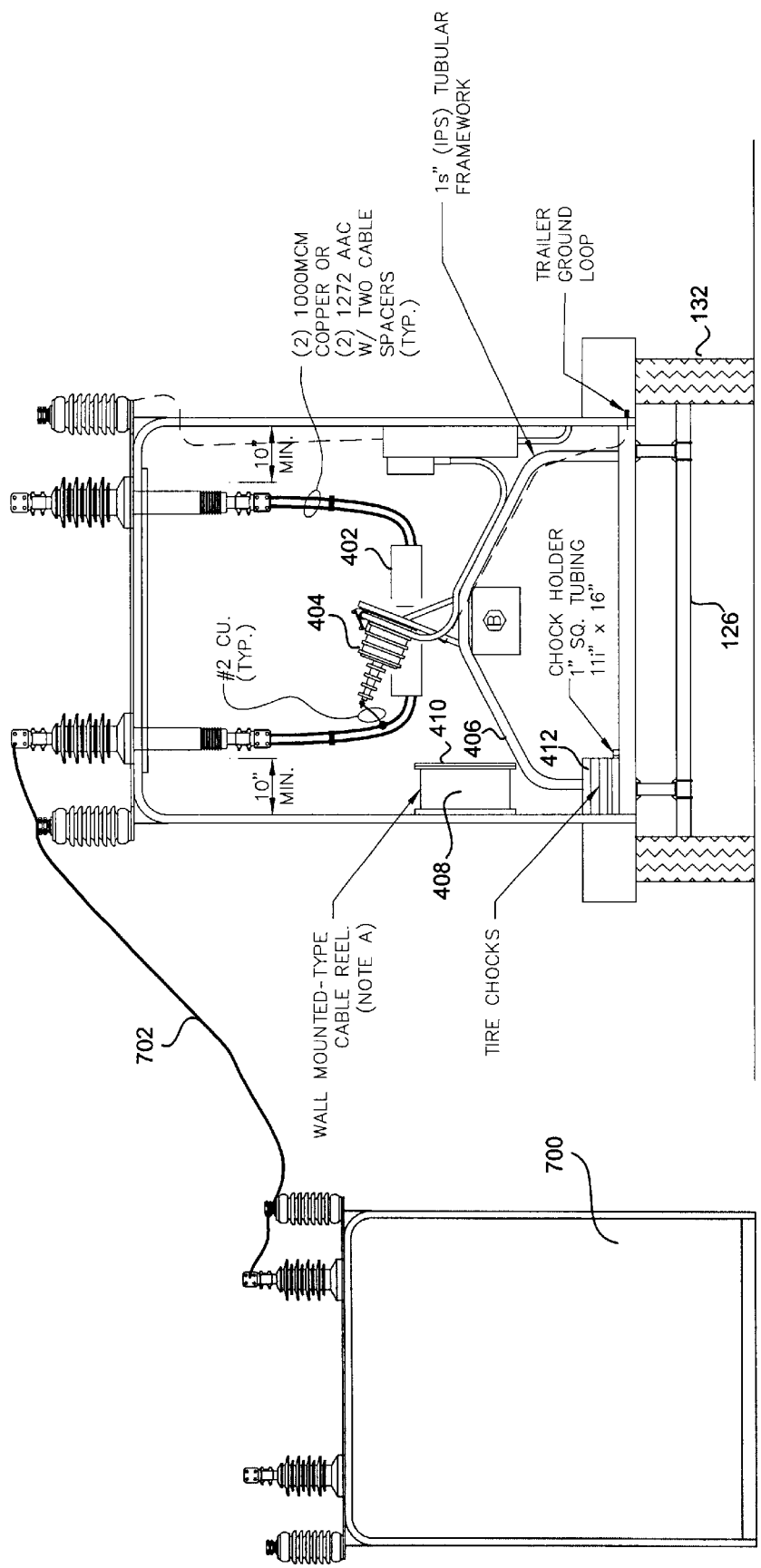
FIG. 7 is a section view showing the MMS connected to a substation transformer.

FIG. 7 is a section view showing the MMS 100 connected to a power transformer 700. The power transformer 700 can be a fixed substation transformer or a mobile substation transformer that is replacing a substation transformer that is out of service. The source conductor 702 is connected from the secondary side bushings of the power transformer 700 to the source side bushings 204 of the MMS 100. Alternatively, the MMS 100 can be as a remote-metering point that is not adjacent to a transformer, provided that the voltage level of the source conductor 702 being metered or monitored does not exceed the voltage rating of the MMS 100.

The foregoing description of the preferred embodiments of the invention has been presented only for the purpose of illustration and description and is not intended to be exhaustive or to limit the invention to the precise forms disclosed.

For example, the MMS can be used in conjunction with a fixed or mobile substation, or without a substation, such as to monitor voltage drop on a continuous distribution or transmission line. The MMS 100 may measure one, two, or all three phases of a particular power source. The NMS 100 may meter voltage only, or current only. The MMS 100 may also utilize a variety of types and combinations of electrical revenue meters.

Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated.

What is claimed is:

1. A portable monitoring apparatus for being transported to a location in a electrical power transmission or distribution network and for use in monitoring signals that are carried over a line in the power distribution network, comprising:
    a platform for being transported to the location in the electrical power transmission or distribution network;
    an instrument transformer mounted to the platform and having a primary side and a secondary side, with the primary side having a greater number of windings than the secondary side and having an input terminal and an output terminal;
    a source side bushing, mounted on and insulated from the platform, for connecting a source side of the line to the input terminal of the primary side of the instrument transformer; and
    a load side bushing, mounted on and insulated from the platform, for connecting a load side of the line to the output terminal of the primary side of the instrument transformer;
    the secondary side of the instrument transformer reducing a magnitude of the parameter of the signals on the line and outputting monitoring signals;
    the secondary side of the instrument transformer providing the monitoring signals to a monitoring apparatus;
    wherein the monitoring apparatus is for monitoring the parameter of the signals that are carried on the line.

2. The portable monitoring apparatus of claim 1, wherein the instrument transformer is for reducing the magnitude of voltage of the signals.

3. The portable monitoring apparatus of claim 1, wherein the instrument transformer is for reducing the magnitude of current of the signals.

4. The portable monitoring apparatus of claim 1, wherein the line comprises a three phase line and wherein:
    the instrument transformer comprises three instrument transformers for the three phases of the line, respectively;
    the source side bushing comprises three source side bushings, for connecting the source side each of the three line phases to the input terminals of the primary side of the instrument transformer;
    the load side bushing comprises three load side bushings, for connecting the load side of each of the three line phases to the output terminals of the primary side of the instrument transformer;
    for metering each phase of the parameter.

5. The portable monitoring apparatus of claim 1, further comprising a fixed power transformer connected to the source conductor.

6. The portable monitoring apparatus of claim 1, further comprising a mobile sub-station transformer connected to the source conductor wherein the monitoring instrument is for monitoring an output of the mobile sub-station transformer.

7. The portable monitoring apparatus of claim 1, further comprising the monitoring instrument.

8. The portable monitoring apparatus of claim 7, wherein the monitoring instrument comprises an electrical revenue meter and the parameter comprises voltage and current.

9. The portable monitoring apparatus of claim 1, further comprising a remote terminal unit connected to monitoring instrument for providing remote control of the monitoring instrument.

10. The portable monitoring apparatus of claim 1, further comprising a recloser connected to the source side of the line for interrupting the supply of the signals to the load side of the line.

11. The portable monitoring apparatus of claim 1, further comprising a circuit breaker connected to the source side of the line for interrupting the supply of the signals to the load side of the line.

12. The portable monitoring apparatus of claim 1, further comprising a station service transformer for receiving the source side of the line and for outputting operating power.

13. The monitoring apparatus of claim 1, further comprising:
   a source side insulator mounted on the platform for insulating the platform from the source side conductor; and
   a load side insulator mounted on the platform for insulating the platform from the load side conductor.

14. The portable monitoring apparatus of claim 13, further comprising:
   an electrically conductive grounding grid mounted on the platform, the grounding grid for grounding the load side insulator and the source side insulator;
   an electrically conductive ground loop connected to the grounding grid, and to the instrument transformer, the ground loop for grounding the instrument transformer; and
   a ground cable for connecting the grounding grid and the ground loop to an earth ground.

15. The monitoring apparatus of claim 1, wherein the platform comprises a trailer having wheels and wherein the source side bushing, the load side bushing, and the instrument transformer are mounted on the trailer.

16. The monitoring apparatus of claim 15, wherein the trailer further comprises a roof panel, a front panel, a rear panel, a source side panel, and a load side panel wherein the roof, front, source side, and load side panels form an enclosure within the trailer.

17. A method of connecting a trailer-mounted portable monitoring apparatus to a line in a power transmission or distribution network, comprising:
   transporting the portable monitoring apparatus to the line at a point within the power transmission or distribution network;
   electrically connecting a source side of the line to a first power bushing that is mounted onto the trailer and which is electrically isolated from the portable monitoring apparatus;
   electrically connecting a load side of the line to a second power bushing that is mounted onto the trailer and which is electrically isolated from the portable monitoring apparatus;
   grounding the portable monitoring apparatus; and
   monitoring the line from monitored signals obtained through the source side of the line and passed through to the load side of the line.

18. The method of claim 17, wherein monitoring the line comprises metering power delivered to the load side of the line.

19. The method of claim 17, further comprising:
   mechanically connecting the source side of the line to a first post insulator mounted on an electrically conducting grounding grid, the grounding grid being mounted on the portable monitoring apparatus; and
   mechanically connecting the load side of the line to a second post insulator mounted on the electrically conducting grounding grid.

20. The method of claim 17, wherein connecting the source side of the line comprises connecting the first power bushing to a secondary side of a power transformer.

21. The method of claim 17, wherein connecting the source side of the line comprises connecting the first power bushing to a secondary side of a mobile power transformer.

22. The method of claim 17, further comprising:
   electrically connecting the grounding grid to a grounding conductor; and
   electrically connecting the grounding conductor to an earth ground.

23. The method of claim 17, wherein monitoring the line comprising coupling the monitored signals to a monitoring instrument.

* * * * *